(12) United States Patent
Hu et al.

(10) Patent No.: US 10,756,144 B2
(45) Date of Patent: Aug. 25, 2020

(54) ELECTROLUMINESCENT DEVICE HAVING STACKED MICRO LIGHT EMITTING DIODE UNIT AND ORGANIC LIGHT EMITTING DIODE UNIT, DISPLAY DEVICE AND MANUFACTURING METHOD THEREOF

(71) Applicants: BOE TECHNOLOGY GROUP CO., LTD., Beijing (CN); HEFEI XINSHENG OPTOELECTRONICS TECHNOLOGY CO., LTD., Hefei, Anhui (CN)

(72) Inventors: Yue Hu, Beijing (CN); Chinlung Liao, Beijing (CN); Huaiting Shih, Beijing (CN)

(73) Assignees: BOE TECHNOLOGY GROUP CO., LTD., Beijing (CN); HEFEI XINSHENG OPTOELECTRONICS TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/991,602

(22) Filed: May 29, 2018

(65) Prior Publication Data

US 2019/0181184 A1 Jun. 13, 2019

(30) Foreign Application Priority Data

Dec. 13, 2017 (CN) .......................... 2017 1 1328549

(51) Int. Cl.
*H01L 29/00* (2006.01)
*H01L 27/32* (2006.01)
(Continued)

(52) U.S. Cl.
CPC ............ *H01L 27/322* (2013.01); *H01L 25/04* (2013.01); *H01L 25/167* (2013.01);
(Continued)

(58) Field of Classification Search
USPC .......................................................... 257/40
See application file for complete search history.

(56) References Cited

U.S. PATENT DOCUMENTS

| | | | |
|---|---|---|---|
| 10,416,565 B2* | 9/2019 | Ahmed | .................. G02B 1/002 |
| 2014/0104243 A1* | 4/2014 | Sakariya | .............. G09G 3/3216 |
| | | | 345/204 |

(Continued)

FOREIGN PATENT DOCUMENTS

| | | |
|---|---|---|
| CN | 203165896 U | 8/2013 |
| CN | 203674210 U | 6/2014 |
| DE | 10 2011 083 247 | 3/2013 |

OTHER PUBLICATIONS

First Office Action for CN Application No. 201711328549.3, dated Dec. 21, 2017.

*Primary Examiner* — Caleb E Henry
(74) *Attorney, Agent, or Firm* — Dinsmore & Shohl LLP (57) ABSTRACT

The embodiments of the present disclosure disclose an electroluminescent device, a display device and a manufacturing method thereof. The electroluminescent device comprises: a substrate; a micro light emitting diode unit, configured to emit light of a first color in a first direction; and an organic light emitting diode unit, configured to emit light of a second color in the first direction, wherein the micro light emitting diode unit and the organic light emitting diode unit are disposed on the substrate in a stack, such that light of the first color and light of the second color are mixed to generate mixed light, and the first direction is a direction towards the substrate or a direction away from the substrate.

17 Claims, 2 Drawing Sheets

(51) Int. Cl.

| | | |
|---|---|---|
| | *H01L 51/56* | (2006.01) |
| | *H01L 51/52* | (2006.01) |
| | *H01L 51/50* | (2006.01) |
| | *H01L 25/04* | (2014.01) |
| | *H01L 25/16* | (2006.01) |
| | *H01L 25/075* | (2006.01) |
| | *H01L 33/08* | (2010.01) |

(52) U.S. Cl.
CPC ...... *H01L 27/3225* (2013.01); *H01L 27/3246* (2013.01); *H01L 51/5036* (2013.01); *H01L 51/5056* (2013.01); *H01L 51/5072* (2013.01); *H01L 51/5203* (2013.01); *H01L 51/56* (2013.01); *H01L 25/0753* (2013.01); *H01L 25/0756* (2013.01); *H01L 27/3209* (2013.01); *H01L 27/3213* (2013.01); *H01L 33/08* (2013.01); *H01L 2251/5323* (2013.01)

(56) References Cited

U.S. PATENT DOCUMENTS

| | | | |
|---|---|---|---|
| 2016/0064363 A1 | 3/2016 | Bower et al. | |
| 2016/0211415 A1* | 7/2016 | Huang | H01L 21/4853 |
| 2016/0372690 A1* | 12/2016 | Hack | H01L 51/0097 |
| 2017/0084671 A1* | 3/2017 | Hack | H01L 27/3225 |
| 2017/0179092 A1* | 6/2017 | Sasaki | H01L 25/50 |
| 2018/0069048 A1* | 3/2018 | Wu | G02B 5/208 |
| 2018/0157357 A1* | 6/2018 | Lin | H01L 27/1222 |
| 2018/0166512 A1* | 6/2018 | Hack | H01L 27/3218 |
| 2018/0175248 A1* | 6/2018 | Ahmed | H01L 23/66 |
| 2018/0373092 A1* | 12/2018 | Eley | G02F 1/133533 |
| 2019/0013365 A1* | 1/2019 | Lin | H01L 51/0097 |

* cited by examiner

ELECTROLUMINESCENT DEVICE HAVING STACKED MICRO LIGHT EMITTING DIODE UNIT AND ORGANIC LIGHT EMITTING DIODE UNIT, DISPLAY DEVICE AND MANUFACTURING METHOD THEREOF

CROSS-REFERENCE TO RELATED APPLICATIONS

The present application claims priority to Chinese Patent Application No. 201711328549.3, filed on Dec. 13, 2017, the disclosure of which is hereby incorporated by reference herein in its entirety.

TECHNICAL FIELD

The present disclosure relates to an electroluminescent device, a display device and a manufacturing method thereof.

BACKGROUND

The traditional light emitting diode (LED) is used as backlight in the display technology. The display technology at present has been developed from backlight into a self-luminescent type including the techniques such as organic light emitting diode (OLED) and micro light emitting diode (Micro LED). Among them, the Micro LED technology, i.e., LED scaling-down and matrix technology, refers to the LED arrays with high-density and micro-size integrated on one chip. The size of Micro LED is scaled down to a micron level, and not only each point of pixel can be controlled by addressing and driven to emit light at single point, but also there are the advantages including high brightness, low power consumption, and ultra-high resolution and color saturation. The OLED is a current-type device, in which the brightness is determined by the amplitude of current flowing through the OLED.

SUMMARY

The embodiments of the present disclosure provide an electroluminescent device, which comprises: a substrate; a micro light emitting diode unit, configured to emit light of a first color in a first direction; and an organic light emitting diode unit, configured to emit light of a second color in the first direction, wherein, the micro light emitting diode unit and the organic light emitting diode unit are disposed on the substrate in a stack, such that the light of the first color and the light of the second color are mixed to generate mixed light, and the first direction is a direction towards the substrate or a direction away from the substrate.

In some embodiments, the organic light emitting diode unit is on a side of the micro light emitting diode unit away from the substrate.

In some embodiments, the first direction is a direction toward the substrate, and the light of the second color emerges through the micro light emitting diode unit and is mixed with the light of the first color emitted by the micro light emitting diode unit.

In some embodiments, the first direction is a direction away from the substrate, and the light of the first color emerges through the organic light emitting diode unit and is mixed with light of the second color emitted by the organic light emitting diode unit.

In some embodiments, the substrate is a glass substrate.

In some embodiments, the first color and the second color are different, and light of the first color and light of the second color are mixed to form white light.

In some embodiments, the first color and the second color are the same.

In some embodiments, the electroluminescent device further comprises a color filter layer, which is arranged such that the mixed light is transmitted through the color filter layer.

In some embodiments, the color filter layer is directly formed on the substrate, and the first direction is a direction toward the substrate.

In some embodiments, the color filter layer is formed on a side of the electroluminescent device away from the substrate, andthe first direction is in a direction away from the substrate.

In some embodiments, an electrode among the electrodes of the micro light emitting diode unit and the organic light emitting diode unit, which is provided most upstream in the first direction is a reflective electrode.

In some embodiments, the micro light emitting diode unit is on a side of the organic light emitting diode unit away from the substrate.

The embodiments of the present disclosure provide a display device, which comprises the electroluminescent device according to any one of the aforementioned.

In some embodiments, in the display device according to the embodiments of the present disclosure, three adjacent electroluminescent devices respectively serving as three sub-pixels of different colors constitute one pixel unit.

In some embodiments, in the display device according to the embodiments of the present disclosure, four adjacent electroluminescent devices respectively serving as four sub-pixels of different colors constitute one pixel unit.

The embodiments of the present disclosure provide a method of manufacturing a display device, comprising: forming on a substrate a layer of micro light emitting diode units and a layer of organic light emitting diode units arranged in a stack, such that each micro light emitting diode unit in the layer of micro light emitting diode units respectively emits light of a first color in a first direction, and each organic light emitting diode unit in the layer of organic light emitting diode units respectively emits light of a second color in the first direction, wherein, light of the first color emitted by each micro light emitting diode and light of the second color light emitted by a corresponding organic light emitting diode are mixed to generate mixed light, and the first direction is a direction towards the substrate or a direction away from the substrate.

In some embodiments, forming on a substrate a layer of micro light emitting diode units and a layer of organic light emitting diode units arranged in a stack includes forming a layer of micro light emitting diode units on the substrate and stacking a layer of organic light emitting diode units on the layer of micro light emitting diode units.

In some embodiments, forming on a substrate a layer of micro light emitting diode units and a layer of organic light emitting diode units arranged in a stack includes forming a layer of organic light emitting diode units on the substrate and stacking a layer of micro light emitting diode units on the layer of organic light emitting diode units.

BRIEF DESCRIPTION OF THE DRAWINGS

The features, advantages, as well as technical and industrial significances of exemplary embodiments of the present disclosure will be described below with reference to the accompanying drawings, in which the same reference signs refer to the same elements, and in which.

DETAILED DESCRIPTION

A detailed description of the embodiments of the present disclosure will be further made in detail below in combination with the accompanying drawings and the specific embodiments, but will not serve as a delimitation on the present disclosure. It is to be noted that, in the present document, the technical term "electroluminescent device" used refers to a composite electroluminescent device in which a micro light emitting diode unit and an organic light emitting diode unit are compounded as described in various arrangements below.

Figure 1:
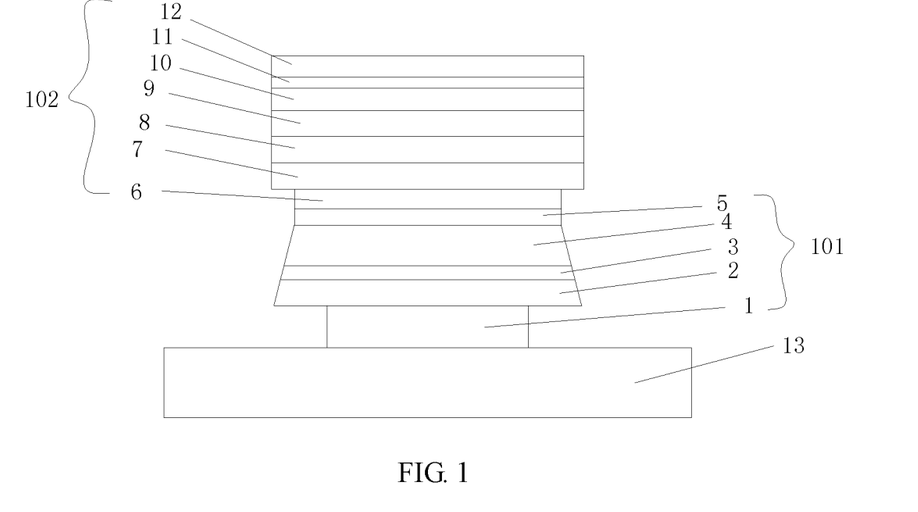
FIG. 1 is a schematic view of the structure of the electroluminescent device according to one or more embodiments of the present disclosure.

As shown in FIG. 1, the present disclosure discloses an electroluminescent device, which comprises: a substrate 13; a micro light emitting diode unit 101 provided on the substrate 13 and configured to emit light of a first color in a first direction; and an organic light emitting diode unit 102 stacked on the micro light emitting diode unit 101 and configured to emit light of a second color in the first direction, wherein light of the first color and light of the second color are mixed to generate mixed light, and the first direction is a direction towards the substrate or a direction away from the substrate. In some embodiments, when the first direction is a direction toward the substrate, light of the second color emerges through the micro light emitting diode unit 101 and is mixed with light of the first color emitted by the micro light emitting diode unit 101. In some further embodiments, when the first direction is a direction away from the substrate, light of the first color emerges through the organic light emitting diode unit 102 and is mixed with light of the second color emitted by the organic light emitting diode unit 102. The micro light emitting diode unit 101 and the organic light emitting diode unit 102 have conventional structures in the technical filed of the LED display, and the exemplary structures of them are given below in combination with FIG. 1. It is to be appreciated that, the structures of them are not limited thereto, and the structures of them that can be known by those skilled in the art are covered in the present disclosure, as long as in the electroluminescent device formed by compounding them, they emit light of a first color and a second color in the same direction respectively, and the emergent light of the first color and light of the second color can be adequately mixed.

In the above embodiments of the present disclosure, the organic light emitting diode unit 102 is stacked on the micro light emitting diode unit 101, i.e., the organic light emitting diode unit 102 is on a side of the micro light emitting diode unit 101 away from the substrate 13. However, in one or more embodiments of the present disclosure, the micro light emitting diode unit 101 is stacked on the organic light emitting diode unit 102, i.e., the micro light emitting diode unit is on a side of the organic light emitting diode unit away from the substrate. In other words, the stacking sequence of the micro light emitting diode unit 101 and the organic light emitting diode unit 102 may be interchanged. Generally, in the present disclosure, the micro light emitting diode unit 101 and the organic light emitting diode unit 102 are disposed on the substrate in a stack, such that light of the first color and light of the second color are mixed to generate mixed light.

Various ways can be used to cause the micro light emitting diode unit 101 and the organic light emitting diode unit 102 to emit light of various colors.

Taking the micro light emitting diode unit 101 as example, the micro light emitting diode unit 101 (Micro LED) may include a light emitting layer 3. The light emitting layer 3 is adapted to emit light of a first color. In one or more embodiments, the light emitting layer 3 may be mixed with a first light emitting material adapted to emit light of a first color. For example, the light emitting layer 3 may be a fluorescent layer, in which a fluorescent material serves as a first light emitting material and can emit light of a first color under the excitation of excitation light. The configuration of the light emitting layer 3 is not limited to this. In one or more embodiments, the light emitting layer 3 may be a quantum well layer that can be excited to emit light of a first color. In the quantum well layer, a single well or a plurality of wells may be provided so as to emit light of a desired color. Taking a plurality of wells as example, light of a desired color, which cannot be obtained by a single well, may be obtained by mixing light of various colors emitted from the respective wells.

The organic light emitting diode unit 102 includes a light emitting layer 9, which is adapted to emit light of the same or different colors with respect to the light emitting layer 3. In one or more embodiments, the light emitting layer 9 contains a second light emitting material. The second light emitting material is adapted to emit light of the same or different colors with respect to the first light emitting material. By disposing the micro light emitting diode unit 101 and the organic light emitting diode unit 102 in a stack, the light emitting layer 3 cooperates with the light emitting layer 9 to emit light together. The brightness of the electroluminescent device may increase and the power consumption may decrease with respect to a separate micro light emitting diode or organic light emitting diode. Further, the blue spectral component of the light emitted by the micro organic light emitting diode 101 can beneficially complement the weak blue light of the light emitted by the organic light emitting diode unit 102.

The micro light emitting diode unit 101 and the organic light emitting diode unit 102 may employ a suitable arrangement of a bottom emission type or a top emission type. In the bottom emission type of the micro light emitting diode unit 101 and the organic light emitting diode unit 102, the first direction is a direction toward the substrate, and the light of the first color emitted by the micro light emitting diode unit 101 and the light of the second color emitted by the organic light emitting diode unit 102 emerge through the substrate and are mixed. At this time, the substrate is a transparent glass substrate. In the top emission type of the micro light emitting diode unit 101 and the organic light emitting diode unit 102, the first direction is a direction away from the substrate, and the light of the first color emitted by the micro light emitting diode unit 101 and the light of the second color emitted by the organic light emitting diode unit 102 emerge and are mixed on a side away from the substrate. These two light emission manners may also be respectively referred to as the "bottom emission" type and "top emission"

type of the electroluminescent device itself. In a "bottom emission" type electroluminescent device, the emitted light can emerge only partially from the opening provided in the drive panel (including a plurality of thin film transistors), so that considerable light emission is wasted and the aperture opening ratio is low. In a "top emission" type electroluminescent device, light emerges from the top portion without being affected by thin film transistors on the drive panel, and the aperture opening ratio is relatively high.

The structure of the "bottom emission" electroluminescent device will be described below as an example.

As shown in FIG. 1, as an example, the micro light emitting diode unit 101 is a p-n junction diode manufactured on a substrate (also referred to as a backplate) 13 prepared with a thin film transistor, a pixel defining layer, and the like. In one or more embodiments, the micro light emitting diode unit 101 includes a first bottom electrode 1, a p-doped layer 2, a light emitting layer 3, an n-doped layer 4, and a first top electrode 5 that are sequentially stacked. The light emitting layer 3 is located between the p-doped layer 2 and the n-doped layer 4, and the first bottom electrode 1 is a transparent electrode. For example, the first top electrode 5 may be a transparent electrode. In one or more embodiments, the first top electrode 5 may be made of metals such as Mg and Ag as well as alloys. In the processing flow, the n-doped layer 4 may also be provided with a patterned masking layer (not shown in the figure), for manufacturing a diode structure thereon, and the masking layer is removed after the diode structure is manufactured.

The substrate 13 is disposed under the first bottom electrode 1 of the micro light emitting diode unit 101. The material of the substrate 13 may be glass or a silicon wafer. In the present example, the substrate 13 may be a glass substrate in order to allow light to be emitted in the direction toward the substrate and emerge through the substrate toward the lower side of the substrate. The substrate 13 can also be flexible as desired, so that the electroluminescent device and the corresponding display device obtained may be flexible. This flexible feature fully expands its range of application and gives users new sensory enjoyment in lighting and display.

After that, the organic light emitting diode unit 102 (LED) may be stacked on the micro light emitting diode unit 101. In one or more embodiments, the organic light emitting diode unit 102 includes a second bottom electrode 6, a hole injection layer 7, a hole transport layer 8, a light emitting layer 9, an electron transport layer 10, an electron injection layer 11 and a second top electrode 12 sequentially stacked. In one or more embodiments, an indium tin oxide (ITO) layer may be manufactured on the prepared first top electrode 5 using, for example, a sputtering method, and the ITO layer serves as the second bottom electrode 6. The light emitting layer 9 is located between the hole transport layer 8 and the electron transport layer 10. Each layer of the OLED 102 may be formed by a method of vacuum evaporation or inkjet printing. It is to be noted that the organic light emitting diode unit 102 (LED) adopts a bottom emission structure, that is, the second top electrode 12 serves as a cathode, and the second bottom electrode 6 is a transparent ITO layer. Thus, the light emitted from the light emitting layer 9 can sequentially transmit through the hole transport layer 8, the hole injection layer 7, and the transparent second bottom electrode 6 in the direction toward the substrate and emerge toward the lower side of the substrate 13. In view that the first top electrode 5 and the first bottom electrode 1 in the micro light emitting diode unit 101 are both transparent electrodes, the emergent light of the organic light emitting diode unit 102 (LED) as a whole in the direction toward the substrate 13 may also continue to sequentially transmit through the transparent first top electrode 5, the n-doped layer 4, the light emitting layer 3, the p-doped layer 2, and the transparent first bottom electrode 1 of the micro light emitting diode unit 101 and emerge toward the lower side of the substrate 13. In addition, in the micro light emitting diode unit 101, the light emitted from the light emitting layer 3 can also sequentially transmit through the p-doped layer 2 and the transparent first bottom electrode 1 in the direction toward the substrate 13 and emerge toward the lower side of the substrate 13. Therefore, both the light emitted from the light emitting layer 9 and the light emitted from the light emitting layer 3 can transmit through the substrate 13 in the direction toward the substrate 13 and emerge toward the lower side thereof and can be mixed, to obtain light of a desired color.

In addition, as discussed above, in some embodiments, the micro light emitting diode unit 101 is stacked on the organic light emitting diode unit 102, and similar technical effects are obtained.

The structure of the "bottom emission" type electroluminescent device has been exemplified above, and those skilled in the art can obtain the corresponding structure of the "top emission" type electroluminescent device based on its understanding and the disclosed content of the present disclosure, which will not be repeated here. It is to be noted that the reflective electrode cannot be disposed between the micro light emitting diode unit 101 and the organic light emitting diode unit 102 so as not to hinder the light transmission. In one or more embodiments, the reflective electrode may be disposed on a side of the electroluminescent device that is opposite to the light emission direction. That is, an electrode among the electrodes of the micro light emitting diode unit 101 and the organic light emitting diode 102, which is provided most upstream in the first direction may serve as a reflective electrode. For example, when the electroluminescent device adopts a top emission type, the first bottom electrode 1 located at the bottom of the entire electroluminescent device may be a reflective electrode. For example, when the electroluminescent device uses a bottom emission type, the second top electrode 12 located on top of the entire electroluminescent device may be a reflective electrode. By providing the reflective electrode, the light traveling in the light emission direction of the device may be reflected to the light reflection direction, thereby improving the utilization rate of the emitted light, and improving the brightness of the light emission and so on.

In one or more embodiments, the colors of light emitted from the light emitting layer 3 and the light emitting layer 9 may be different. In one or more embodiments, light emitted from the light emitting layer 3 and the light emitting layer 9 are mixed to form white light to serve as a white sub-pixel. Such electroluminescent device may be used directly for making a lighting product, for example. Furthermore, by adjusting the spectrum of the light emitted by the light emitting layer 3 and the light emitting layer 9 (for example, by adjusting the first light emitting material and the second light emitting material), a lighting product having a greater color rendering index may be manufactured.

There may be a plurality of variations to the embodiments of the electroluminescent device, which will be described below, in an illustrative instead of an exhaustive manner.

Further, on the basis of the electroluminescent device of the above embodiments, the electroluminescent device may further include a color filter layer (not shown in FIG. 1), and the electroluminescent device may be made to serve as a sub-pixel of a corresponding color by providing a color filter layer of different colors, i.e. the color of the color filter layer determines the color of the sub-pixels of the electroluminescent device.

In one embodiment, the light emitted from the first light emitting material mix ed in the light emitting layer 3 and the second light emitting material contained in the light emitting layer 9 are mixed to form white light. Specifically, as an example, the first light emitting material mixed in the light emitting layer 3 of the electroluminescent device is a blue light material, and the second light emitting material contained in the light emitting layer 9 is a red light material or a yellow light material. The blue light material mixed in the light emitting layer 3 may be, for example, an anthracene derivative blue light material (for example, 2-(4-t-butylphenyl)-5-(4-(2-(9,10-bis($\alpha$-naphthyl group)) anthracene) biphenyl)-1,3,4-oxadiazole ($\alpha$-ADN-2-PBD) or a fluorene derivative blue light material. As another example, the light emitting layer 3 may use a quantum well layer (gallium nitride, indium gallium nitride, and zinc selenide) to emit blue light. In addition, examples in which the light emitting layer 3 includes the first light emitting material and the quantum well layer may be combined with each other. The red light material contained in the light emitting layer 9 may be, a red light dye such as 4-dicyanomethyl-2-methyl-6-(p-dimethylaminostyrene) H-pyran (DCM), $CaxSi5N2:Eu2+$, $SrxSi5N2:Eu2+$ or $BaxSi5N2$, and the yellow material contained in the light emitting layer 9 may be a yellow dye such as rubrene. The various color materials above are merely examples, and as a matter of fact, various light emitting materials may be applied. Various light emitting dyes that a re newly developed after the present disclosure are also applicable to this disclosure.

Blue light is emitted by adding a blue light material into the light emitting layer 3 of the micro light emitting diode unit 101 and/or using a quantum well layer made of gallium nitride, indium gallium nitride, zinc selenide, or the like in the micro light emitting diode unit 101, so that the electroluminescent device as a whole can emit strong blue light. Therefore, the electroluminescent device can complement the blue light emitted by the organic light emitting diode as a whole, thereby increasing the color gamut of the electroluminescent device within the blue light spectrum.

In addition, in one or more embodiments, the colors of the light emitted by the light emitting layer 3 and the light emitting layer 9 may also be the same so that the electroluminescent device is used as a sub-pixel of a corresponding color. For example, the first light emitting material mixed in the light emitting layer 3 and the second light emitting material contained in the light emitting layer 9 are both blue light materials, so that the electroluminescent device can be used as a blue light sub-pixel. The first light emitting material mixed in the light emitting layer 3 and the second light emitting material contained in the light emitting layer 9 may also be both red light materials, so that the electroluminescent device can be used as a red light sub-pixel. The first light emitting material mixed in the light emitting layer 3 and the second light emitting material contained in the light emitting layer 9 may also be both green light materials, so that the electroluminescent device can be used as a green light sub-pixel. For example, a silicate or aluminate may be mixed in the light emitting layer 3, and coumarin may be contained in the light emitting layer 9.

The present disclosure also discloses a display device which comprises the electroluminescent device in the above embodiments. Since the electroluminescent device described above can emit light, it may be applied to a lighting product. As the electroluminescent device described above has a great brightness, the lighting product using the electroluminescent device also has a great brightness and low power consumption.

Figure 2:
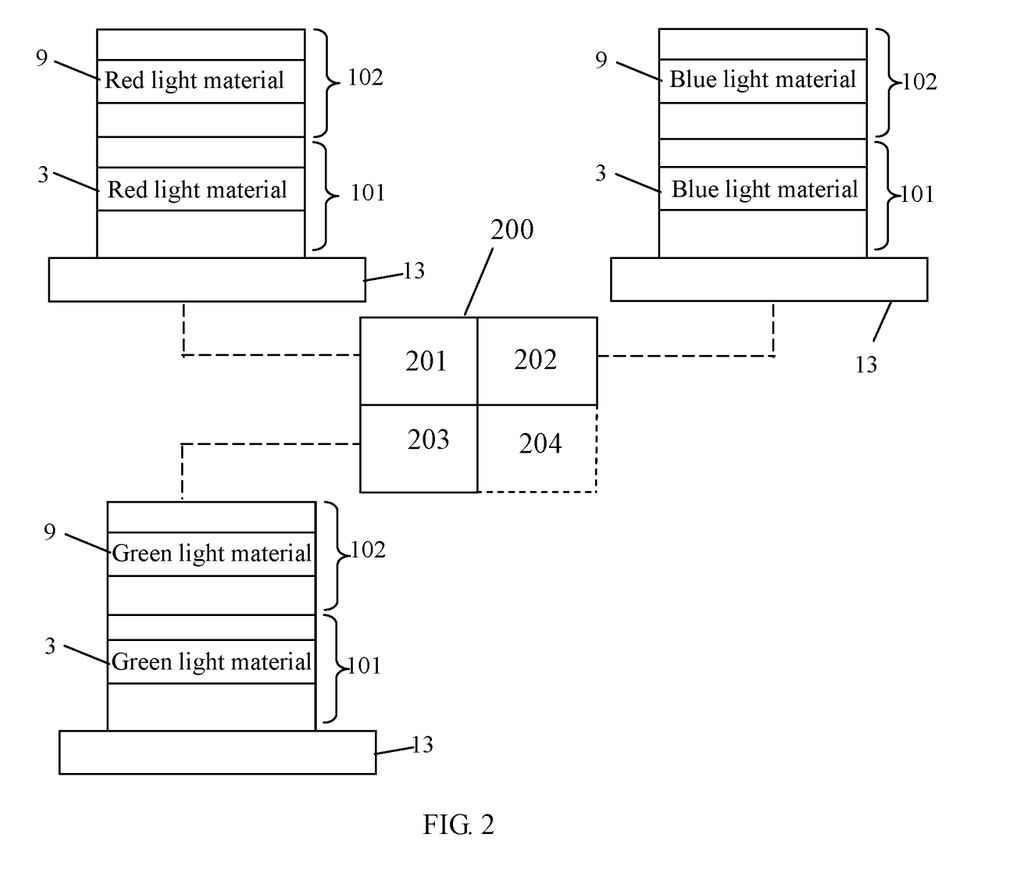
FIG. 2 is a schematic view of the structure of the display device according to one or more embodiments of the present disclosure.

As shown in FIG. 2, a display device according to one or more embodiments of the present disclosure is also disclosed, which comprises the electroluminescent device in the aforementioned embodiments. Among them, four adjacent electroluminescent devices 201-204 serving as four-color sub-pixels constitute a pixel unit, or three adjacent electroluminescent devices 201-203 serving as three-color sub-pixels constitute a pixel unit.

As shown in FIG. 2, in one or more embodiments, the display device is constituted by a pixel unit 200. In one embodiment, the pixel unit 200 may be constituted by three electroluminescent devices. Specifically, the electroluminescent device in which the micro light emitting diode 101 and the organic light emitting diode 102 emit light of the same color is used to constitute a pixel unit 200. The pixel unit 200 includes a red light sub-pixel 201, a blue light sub-pixel 202, and a green light sub-pixel 203. Among them, as an example, the first light emitting material mixed in the light emitting layer 3 and the second light emitting material contained in the light emitting layer 9 of the electroluminescent device as the red light sub-pixel 201 are both red light materials. In addition, the first light emitting material mixed in the light emitting layer 3 and the second light emitting material included in the light emitting layer 9 of the electroluminescent device as the blue light sub-pixel 202 are both blue light materials. In addition, the first light emitting material mixed in the light emitting layer 3 and the second light emitting material contained in the light emitting layer 9 of the electroluminescent device as the green light sub-pixel 203 are both green light materials. Therefore, the pixel unit 200 may be constituted using three electroluminescent devices, and the display of the display device may be controlled by adjusting the three electroluminescent devices contained in the pixel unit 200. As a variation of the present embodiment, the display device includes a pixel unit 200 consisting of four electroluminescent devices, and in addition to a red light sub-pixel 201, a blue light sub-pixel 202, and a green light sub-pixel 203, the pixel unit further includes a fourth sub-pixel 204. The pixel 204 may be for example a white light sub-pixel or other monochromatic sub-pixels. In this case, the fourth sub-pixel 204 may be formed by mixing the light emitted from the micro light emitting diode 101 and the organic light emitting diode 102. By adding the fourth sub-pixel 204, on the one hand, the overall brightness of the electroluminescent device can be increased. On the other hand, the color light required to be displayed can also be added as needed, thereby increasing the color gamut and making the display panel more colorful and richer in color development. When the fourth sub-pixel 204 can be set as a white light sub-pixel as needed, the white light sub-pixel 204 can be configured by arranging the corresponding micro light emitting diode 101 and the organic light emitting diode 102 to mix light emitted from them to form white light.

Figure 3:
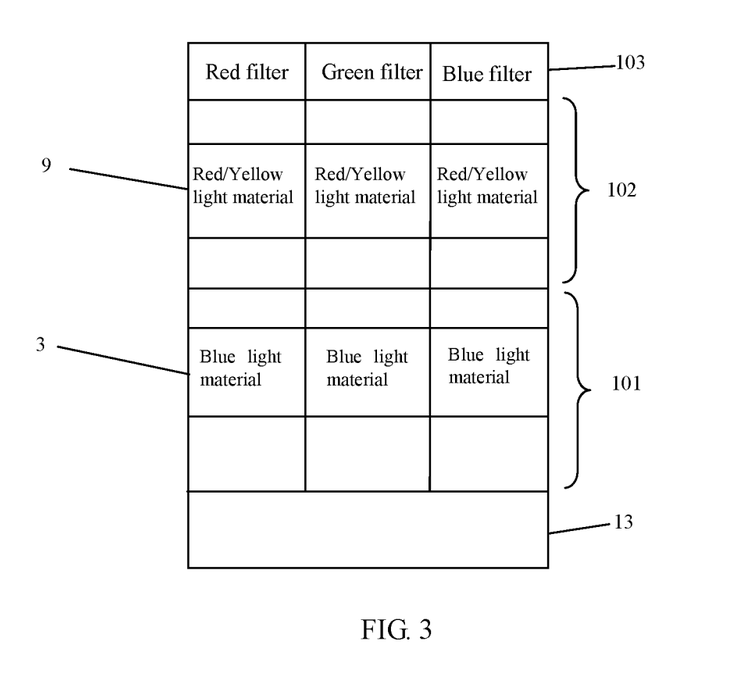
FIG. 3 is a schematic view of the structure of the display device according to one or more embodiments of the present disclosure.

The present disclosure also discloses a display device, as shown in FIG. 3, which comprises a plurality of the aforementioned electroluminescent devices and a color filter layer 103.

In a plurality of the aforementioned electroluminescent devices, the micro light emitting diode 101 and the organic light emitting diode 102 emit light of different colors, which is mixed to form white light.

The color filter layer 103 allows the white light emitting from the electroluminescent device as a whole to emerge through the color filter layer 103, so as to generate light of a corresponding color. With different arrangements of the electroluminescent devices, the color filter layer 103 is also formed differently. Specifically, in the case where the light of the first color emitted by the micro light emitting diode unit 101 and the light of the second color emitted by the organic light emitting diode unit 102 emerge through the glass substrate and are mixed, the color filter layer 103 is formed directly on the substrate 13, i.e., between the micro light emitting diode unit 101/the organic light emitting diode unit 102 and the substrate 13, so that the electroluminescent device is used as a sub-pixel of a corresponding color. In contrast, in the case where the light of the first color emitted by the micro light emitting diode unit 101 and the light of the second color emitted by the organic light emitting diode unit 102 emerge on the side away from the substrate 13 (i.e., emerging without through the substrate 13), the color filter layer 103 is formed on the side of the entire electroluminescent device away from the substrate 13 so that the electroluminescent device is used as a sub-pixel of a corresponding color. As shown in FIG. 3, in the embodiment in which the organic light emitting diode unit 102 is stacked on the micro light emitting diode unit 101, the color filter layer 103 is formed on the side of the organic light emitting diode unit 102 away from the substrate 13. Similarly, in the embodiment in which the micro light emitting diode unit 101 is stacked on the organic light emitting diode unit 102, the color filter layer 103 is formed on the side of the micro light emitting diode unit 101 away from the substrate 13.

As shown in FIG. 3, in one or more embodiments, the display device includes a plurality of pixel cells, each of which is constituted by three electroluminescent devices. Specifically, the electroluminescent device in which the light emitted by the micro light emitting diode 101 and the light emitted by the organic light emitting diode 102 have different colors and are mixed to form white light is used to constitute a pixel unit. By providing the color filter layer 103 on the electroluminescent device, red light, green light, and blue light can be finally emerged. Therefore, the problem of insufficient blue light generated by an individual organic light emitting diode can be solved. By respectively controlling the three electroluminescent devices, the overall display of the display device may be controlled.

As a variation of the present embodiment, the display device includes four such electroluminescent devices so as to constitute each pixel unit. Three of the electroluminescent devices may be provided with a color filter layer 103 to emit red light, green light, and blue light respectively, and the display of the display device may be controlled by adjusting the three electroluminescent devices. The fourth electroluminescent device may not be provided with a color filter layer 103, or may be provided with a color filter layer 103 capable of emitting white light so that the brightness of the entire pixel unit can be increased. In addition, the color filter layer 103 disposed on the fourth electroluminescent device may also emerge light of other colors, so that the entire pixel unit has more abundant colors. By adjusting and equalizing the first light emitting material mixed in the light emitting layer 3 and the second light emitting material contained in the light emitting layer 9 in the fourth electroluminescent device as required, the fourth electroluminescent device is caused to emit color light, for example purple light, other than three primary colors such as RGB. Therefore, the spectrum of the white light emitted by the first to third electroluminescent devices is expanded, so that the light color of the entire electroluminescent device is more abundant, the color gamut is enlarged, and the color rendering index is increased.

The present disclosure further discloses a method of manufacturing a display device, comprising:

forming on a substrate a layer of micro light emitting diode units and a layer of organic light emitting diode units arranged in a stack, such that each micro light emitting diode unit in the layer of micro light emitting diode units respectively emits light of a first color in a first direction, and each organic light emitting diode unit in the layer of organic light emitting diode units respectively emits light of a second color in the first direction, wherein the light of the first color emitted by each micro light emitting diode and the light of the second color light emitted by a corresponding organic light emitting diode are mixed to generate mixed light, and the first direction is a direction towards the substrate or a direction away from the substrate.

Figure 4:
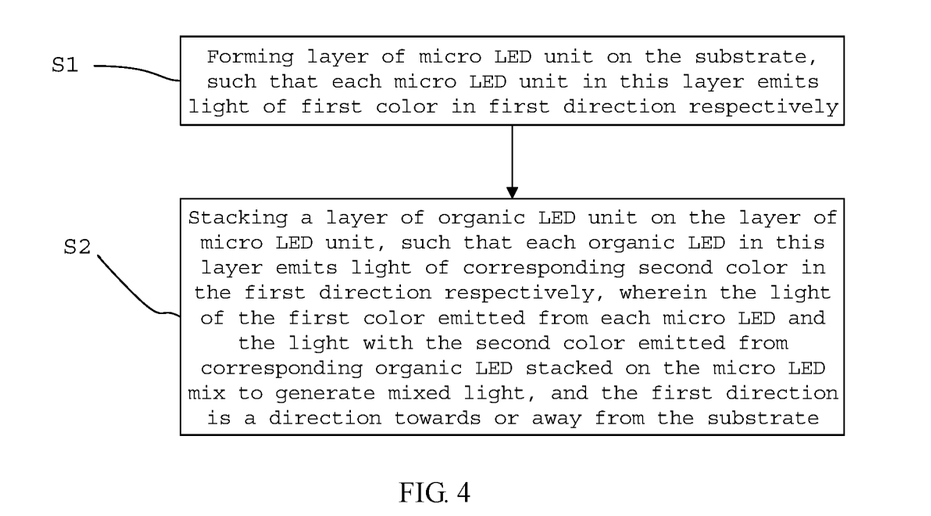
FIG. 4 is a schematic view of the method of manufacturing the display device according to one or more embodiments of the present disclosure.

Specifically, in combination with FIGS. 1 and 4, for the embodiment in which the layer of the organic light emitting diode unit 102 is stacked on the layers of the micro light emitting diode unit 101, the method of manufacturing a display device according to the present disclosure, comprises:

step S1: forming a layer of micro light emitting diode units, such that each micro light emitting diode unit in the layer of micro light emitting diode units respectively emits light of a first color in a first direction; and step S2: forming on a layer of micro light emitting diode units stacked on the layer of organic light emitting diode units, such that each organic light emitting diode unit in the layer of organic light emitting diode units respectively emits light of a second color in the first direction, wherein the light of the first color emitted by each micro light emitting diode is mixed with the light of a second color emitted by a corresponding organic light emitting diode stacked on the micro light emitting diode, to generate mixed light, and the first direction is a direction towards the substrate or a direction away from the substrate.

In other words, in the aforementioned embodiments, forming on a substrate a layer of micro light emitting diode units and a layer of organic light emitting diode units arranged in a stack includes forming a layer of micro light emitting diode units on the substrate and stacking a layer of organic light emitting diode units on the layer of micro light emitting diode units. In some embodiments, when the first direction is a direction toward the substrate, the light of the second color emerges through the layer of the micro light emitting diode unit and is mixed with the light of the first color emitted by the layer of the micro light emitting diode unit. In some further embodiments, when the first direction is a direction away from the substrate, the light of the first color emerges through the layer of the organic light emitting diode unit and is mixed with the light of the second color emitted by the layer of the organic light emitting diode unit.

Further, for the embodiment in which the layer of the micro light emitting diode unit 101 is stacked on the layer of the organic light emitting diode unit 102, forming on a substrate a layer of micro light emitting diode units and a layer of organic light emitting diode units arranged in a stack includes: forming a layer of organic light emitting diode units on the substrate and stacking a layer of micro light emitting diode units on the layer of organic light emitting diode units. In some embodiments, when the first direction is a direction towards the substrate, the light of the first color emerges through the layer of the organic light emitting diode unit and is mixed with the light of the second color emitted by the layer of the organic light emitting diode unit. In some further embodiments, when the first direction is a direction away from the substrate, the light of the second color emerges through the layer of the micro light emitting diode unit and is mixed with the light of the first color emitted by the layer of the micro light emitting diode unit.

Depending on different display devices required, there are differences in the manufacturing method. For example, when the micro light emitting diode 101 and the organic light emitting diode 102 mix the light of two colors to obtain white light, a plurality of electroluminescent devices are used as pixel units. At this time, the pixel units all emit white light, and the manufactured display device may be used as a lighting product. The selection of the corresponding first light emitting material and the selection of the second light emitting material may refer to the description of the electroluminescent device capable of emitting white light, and thus will not be repeated here.

When a color display device needs to be manufactured, it may be manufactured by using the following procedure: by configuring the micro light emitting diode 101 and the organic light emitting diode 102, the electroluminescent device can emit white light as a whole; then, a corresponding color filter layer 103 is cooperatively arranged on each electroluminescent device, so as to enable each electroluminescent device to emerge red, blue, or green light as required respectively, and serve as red light sub-pixel, blue light sub-pixel, or green light sub-pixel. Thus, the red light sub-pixel, the green light sub-pixel, and the green light sub-pixel may serve as one group of pixel units.

When a color display device needs to be manufactured, it may also be manufactured by using the following procedure: by providing the micro light emitting diode 101 and the organic light emitting diode 102 so that both of them can emit the same color light, there is no need for a color film, and the electroluminescent device itself can emit red, blue or green light. Accordingly, the electronic light emitting device capable of emitting red light itself serves as a sub-pixel of red light, the electronic light emitting device capable of emitting blue light itself serves as a sub-pixel of blue light, the electroluminescent device capable of emitting green light itself serves as a sub-pixel of green light, and such three electroluminescent devices may serve as one group of pixel units. Of course, if it is necessary to increase the color gamut of the display device, an electroluminescent device capable of emitting light of other colors may be added as a fourth sub-pixel, which, together with the aforementioned three electroluminescent devices, serve as one group of pixel units, to manufacture the display device. Therefore, the manufactured display device has a wide white spectrum, thereby increasing the color gamut.

The above embodiments which are merely exemplary embodiments of the present disclosure and are not intended to limit the present disclosure. The protection scope of the present disclosure is defined by the claims. Those skilled in the art may make various modifications or equivalent substitutions to the present disclosure within the substance and scope of the present disclosure, and such modifications or equivalent replacements should also be considered to fall within the protection scope of the present disclosure.

What is claimed is:

1. An electroluminescent device, comprising:
    a substrate;
    a micro light emitting diode unit, configured to emit light of a first color in a first direction; and
    an organic light emitting diode unit, configured to emit light of a second color in the first direction, and comprising a quantum well layer, wherein the quantum well layer comprises a plurality of wells for emitting light of various colors,
    wherein the micro light emitting diode unit and the organic light emitting diode unit are disposed on the substrate in a stack, such that the light of the first color emerges through the organic light emitting diode unit and is mixed with the light of the second color within the organic light emitting diode unit, or, the light of the second color emerges through the micro light emitting diode unit and is mixed with the light of the first color within the micro light emitting diode unit, and,
    the first direction is a direction towards the substrate or a direction away from the substrate.

2. The electroluminescent device according to claim 1, wherein
    the organic light emitting diode unit is on a side of the micro light emitting diode unit away from the substrate.

3. The electroluminescent device according to claim 2, wherein
    the first direction is a direction toward the substrate, and the light of the second color emerges through the micro light emitting diode unit and is mixed with the light of the first color emitted by the micro light emitting diode unit.

4. The electroluminescent device according to claim 2, wherein
    the first direction is a direction away from the substrate, and the light of the first color emerges through the organic light emitting diode unit and is mixed with the light of the second color emitted by the organic light emitting diode unit.

5. The electroluminescent device according to claim 3, wherein the substrate is a glass substrate.

6. The electroluminescent device according to claim 1, wherein the first color and the second color are different, and the light of the first color and the light of the second color are mixed to form white light.

7. The electroluminescent device according to claim 1, wherein the first color and the second color are the same.

8. The electroluminescent device according to claim 6, wherein the electroluminescent device further comprises a color filter layer, which is arranged such that the mixed light is transmitted through the color filter layer.

9. The electroluminescent device according to claim 8, wherein the first direction is a direction toward the substrate, and the color filter layer is directly located on the substrate.

10. The electroluminescent device according to claim 8, wherein the first direction is a direction away from the substrate, and the color filter layer is located on a side of the electroluminescent device away from the substrate.

11. The electroluminescent device according to claim 1, wherein an electrode among electrodes of the micro light emitting diode unit and the organic light emitting diode unit, which is provided most upstream in the first direction, is a reflective electrode.

12. The electroluminescent device according to claim 1, wherein the micro light emitting diode unit is on a side of the organic light emitting diode unit away from the substrate.

13. A display device, wherein the display device comprises an electroluminescent device, the electroluminescent device comprising:
    a substrate;
    a micro light emitting diode unit, configured to emit light of a first color in a first direction; and
    an organic light emitting diode unit, configured to emit light of a second color in the first direction, and comprising a quantum well layer, wherein the quantum well layer comprises a plurality of wells for emitting light of various colors, wherein the micro light emitting diode unit and the organic light emitting diode unit are disposed on the substrate in a stack, such that the light of the first color emerges through the organic light emitting diode unit and is mixed with the light of the second color within the organic light emitting diode unit, or, the light of the second color emerges through the micro light emitting diode unit and is mixed with the light of the first color within the micro light emitting diode unit, and the first direction is a direction towards the substrate or a direction away from the substrate.

14. The display device of claim 13, wherein three adjacent electroluminescent devices respectively serving as three sub-pixels of different colors constitute one pixel unit.

15. The display device of claim 13, wherein four adjacent electroluminescent devices respectively serving as four sub-pixels of different colors constitute one pixel unit.

16. The display device of claim 13, wherein the organic light emitting diode unit is on a side of the micro light emitting diode unit away from the substrate.

17. The display device of claim 13, wherein the micro light emitting diode unit is on a side of the organic light emitting diode unit away from the substrate.

* * * * *